United States Patent
Wada

[19]

[11] Patent Number: 5,943,279
[45] Date of Patent: Aug. 24, 1999

[54] SEMICONDUCTOR MEMORY INTEGRATED CIRCUIT

[75] Inventor: Toshio Wada, Tateyama, Japan

[73] Assignee: Nippon Foundry, Inc., Tateyama, Japan

[21] Appl. No.: 09/241,748

[22] Filed: Feb. 1, 1999

[30] Foreign Application Priority Data

Feb. 10, 1998 [JP] Japan .................................. 10-044353

[51] Int. Cl.$^6$ .............................. G11C 7/00; G11C 11/24
[52] U.S. Cl. ......................... 365/205; 365/207; 365/208; 365/149
[58] Field of Search .................................. 365/205, 207, 365/208, 149

[56] References Cited

U.S. PATENT DOCUMENTS

| | | | |
|---|---|---|---|
| 5,293,563 | 3/1994 | Ohta ........................................ | 365/149 |
| 5,329,479 | 7/1994 | Ota et al. ................................. | 365/149 |
| 5,574,681 | 11/1996 | Foss et al. ............................... | 365/205 |
| 5,841,717 | 11/1998 | Yamaguchi ............................ | 365/205 |
| 5,859,794 | 1/1999 | Chan ....................................... | 365/205 |

FOREIGN PATENT DOCUMENTS 61-240497 10/1986 Japan .
62-65295 3/1987 Japan .

*Primary Examiner*—Trong Phan
*Attorney, Agent, or Firm*—Holland & Hart LLP

[57] ABSTRACT

There is provided a semiconductor memory integrated circuit which is formed through high-density integration of memory cells and sense circuits and which is capable of ensuring stable operations even in conjunction with a further reduction in voltage and a further increase in the operating speed of the circuit. Two-transistor memory cells, each of which includes a pair of access transistors and a memory capacitor, are arranged in a matrix pattern. A bit line is shared between adjacent columns of memory cells, and a sense circuit is also shared between adjacent columns of memory cells. The sense circuit includes a first sense circuit formed from n-channel MOS transistors, and a second sense circuit formed from p-channel MOS transistors. After a potential difference between signals of the pair of bit lines is amplified to a certain extent by means of the first sense circuit, the second sense circuit is activated to amplify the signal potential difference to a much greater extent.

6 Claims, 2 Drawing Sheets

SEMICONDUCTOR MEMORY INTEGRATED CIRCUIT

BACKGROUND OF THE INVENTION

1. Field of the Invention

The present invention relates to a semiconductor memory integrated circuit formed through integration of memory cells that includes access transistors and memory capacitors mounted on a semiconductor substrate.

2. Description of the Related Art

In a semiconductor memory integrated circuit typified by Dynamic Random Access Memory (DRAM), an increase in packing density can be realized through reduction of the area on the primary surface of a semiconductor substrate occupied by a memory capacitor, thereby enabling implementation of large-scale integration. In this connection, there have already been devised a technique of forming a stacked memory capacitor formed on the primary surface of the semiconductor substrate so as to extend upward and a technique of forming a trench memory capacitor by etching a trench on the primary surface of the semiconductor substrate. An example of DRAM having such a memory capacitor is one in which a single transistor memory cell comprising one access transistor and one memory capacitor is used as a basic unit of memory. In this type of DRAM, a unit memory cell is formed from a comparatively small number of functional circuit elements, and thus occupies a smaller area. Therefore, the number of memory cells per unit area in the memory element integrated device, i.e., the packaging density of memory element integrated device, can be sufficiently increased. However, in recent years, supply voltage has tended to become lower with the progress in microprocessing technology. This tendency is accompanied by a reduction in a signal amplitude; thus, reliably reading an information signal from the memory cell has become more difficult.

In typical DRAM, one of a pair of bit lines transmits an information signal from a memory cell at a read address, and the remaining bit line receives a signal from a dummy cell. A gate-operational flip-flop circuit (a gated flip-flop) is used as a sense circuit to measure a potential difference between the two bit lines, thereby detecting information. When the foregoing single-transistor-memory-cell DRAM performs a sensing operation such as that set forth, a voltage corresponding to an error in signal potential settings of the dummy cell and to variations in supply potential cannot be utilized as a dead zone of the supply potential. For this reason, a decrease in supply potential associated with progress in microprocessing technique renders stable storing operations difficult. Further, DRAM required for operating at high speed encounters a problem of unstable operations caused by noise developing in the integrated circuit.

To prevent these problems, a two-transistor-memory-cell DRAM has been proposed as described in, e.g., U.S. Pat. No. 5,329,479 and Japanese Patent Application Laid-open No. 61-240497 and 62-65295. In this two-transistor-memory-cell DRAM, a single memory cell is formed from two transistors and one capacitor. An identical information signal is complementarily transmitted from the memory cell to each of a pair of bit lines. In this integrated circuit, a complementary information signal representing identical information is supplied to each of the pair of bit lines, thereby preventing formation of a dead zone in a sense circuit which is connected to a portion of the bit line pair and which amplifies the information signal. As a result, even in a case where the integrated circuit operates at a low voltage and at high speed, stable storing operations can be ensured.

In the two-transistor-memory-cell semiconductor memory integrated circuit comprising two access transistors and one memory capacitor, since the area occupied by the memory cell becomes greater than that in the case of the single-transistor-memory-cell DRAM, integration of DRAM inevitably involves deterioration of packing density. Particularly, in a case where the pitch—at which bit line pairs extending in a certain direction are arranged—is reduced in order to finely process the memory cell, sense circuits for the purpose of detecting an information signal from the bit lines must also be arranged at smaller pitches. However, arrangement of sense circuits at smaller pitches is not easy.

SUMMARY OF THE INVENTION

It is an object of the present invention to provide a semiconductor memory integrated circuit capable of integrating memory cells and sense circuits at high density, as well as of ensuring stable operations even in conjunction with further progress toward lower voltage and faster operations.

A semiconductor memory integrated circuit according to the present invention comprises memory cells arranged in a matrix pattern, wherein each memory cell comprises a pair of access transistors and a memory capacitor which is interposed between the pair of access transistors and is connected to the source or drain of each of the access transistors. The integrated circuit comprises: word lines which are provided in a pair for each row of memory cells, in which the gates of the respective memory cells pertaining to the row are alternately connected with the pair of word lines; bit lines, each of which is provided so as to be shared between two adjacent columns of memory cells, in which the bit line is connected to the drain or source of an individual access transistor of each memory cell pertaining to the individual column of memory cells; and sense circuits, each of which is provided so as to be shared between two adjacent columns of memory cells, wherein each sense circuit detects an information signal appearing on a pair of bit lines corresponding to the respective column of memory cells when a pair of word lines are activated at different timings.

Preferably, the sense circuit may comprise a first gate-operation flip-flop circuit formed from n-channel transistors and a second gate-operation flip-flop circuit formed from p-channel transistors.

Preferably, during a sensing operation, the first flip-flop circuit may be activated at a timing differing from that at which the second flip-flop circuit is activated.

Preferably, during a sensing operation, the first flip-flop circuit may be activated prior to the second flip-flop circuit.

Preferably, the gate of the n-channel transistors of the first flip-flop circuit may be made substantially equal in length to the gate of the p-channel transistors of the second flip-flop circuit.

Preferably, the first flip-flop circuit may have a complementary input node that includes a pair of first transmission transistors capable of controlling at a first timing connection between a pair of bit lines of the column of memory cells, and the second flip-flop circuit may have a pair of first transmission transistors capable of controlling connection between a pair of bit lines of the column of memory cells at a second timing that lags behind the first timing.

In the semiconductor memory integrated circuit according to the present invention, memory cells, each of which comprises two access transistors and one memory capacitor, are arranged in a matrix pattern. Each bit line is shared between the adjacent columns of memory cells, and each sense circuit is also shared between adjacent columns of memory cells. By virtue of the foregoing configuration, stable storing operations are ensured even when the circuit is operated at low voltage and at high speed. Further, a reduction in pitch at which bit lines are arranged and appropriate layout of sense circuits can be readily realized.

Other and further objects, features, and advantages of the present invention will become more apparent from the following description.

DETAILED DESCRIPTION OF THE PREFERRED EMBODIMENT

A semiconductor memory integrated circuit device according to one embodiment of the present invention will be described in detail hereinbelow referring to the accompanying drawings. The embodiment explains a case where the semiconductor memory integrated circuit is applied to DRAM.

Figure 1:
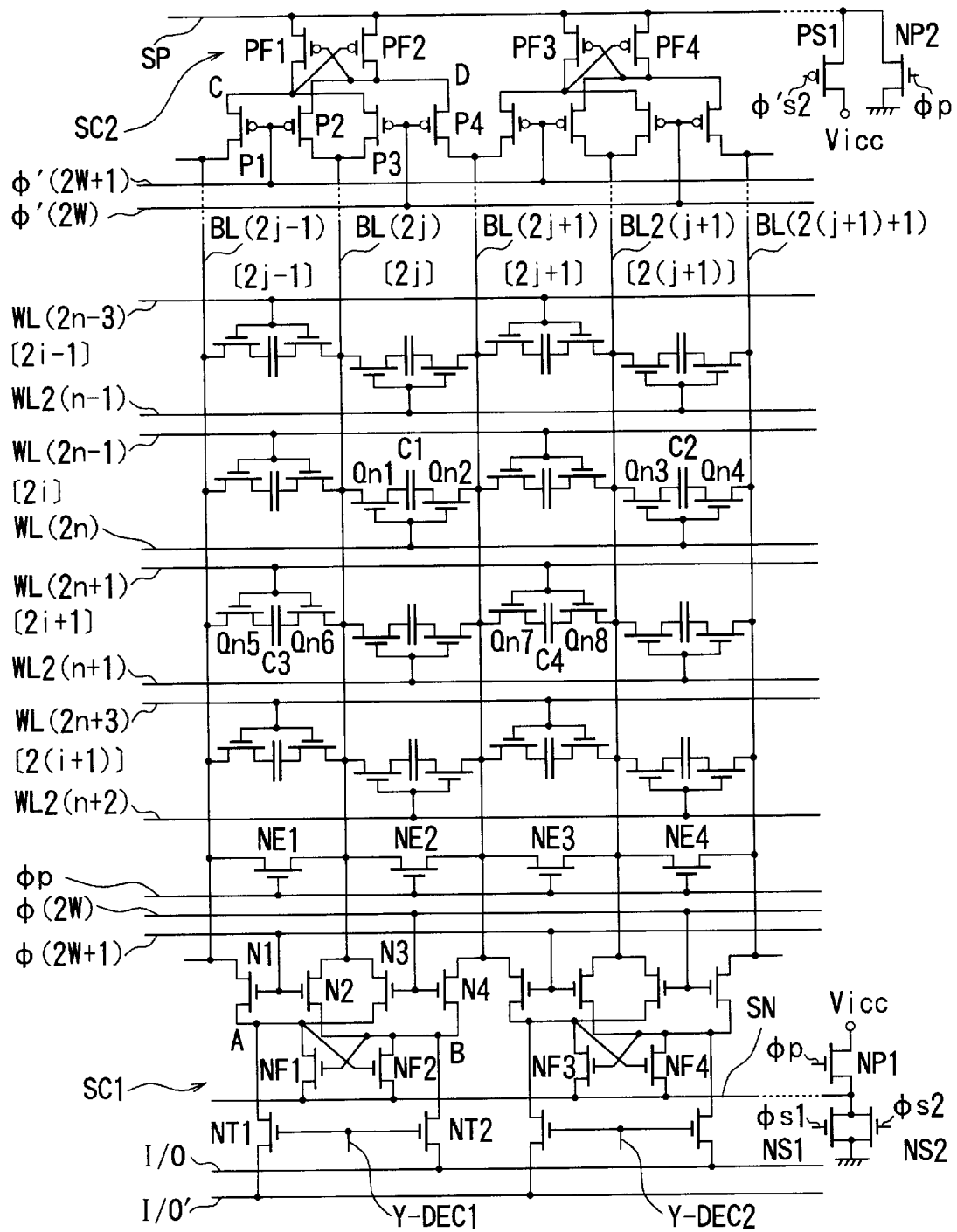
FIG. 1 is a schematic diagram showing the principal configuration of DRAM according to one embodiment of the present invention.
Figure 2:
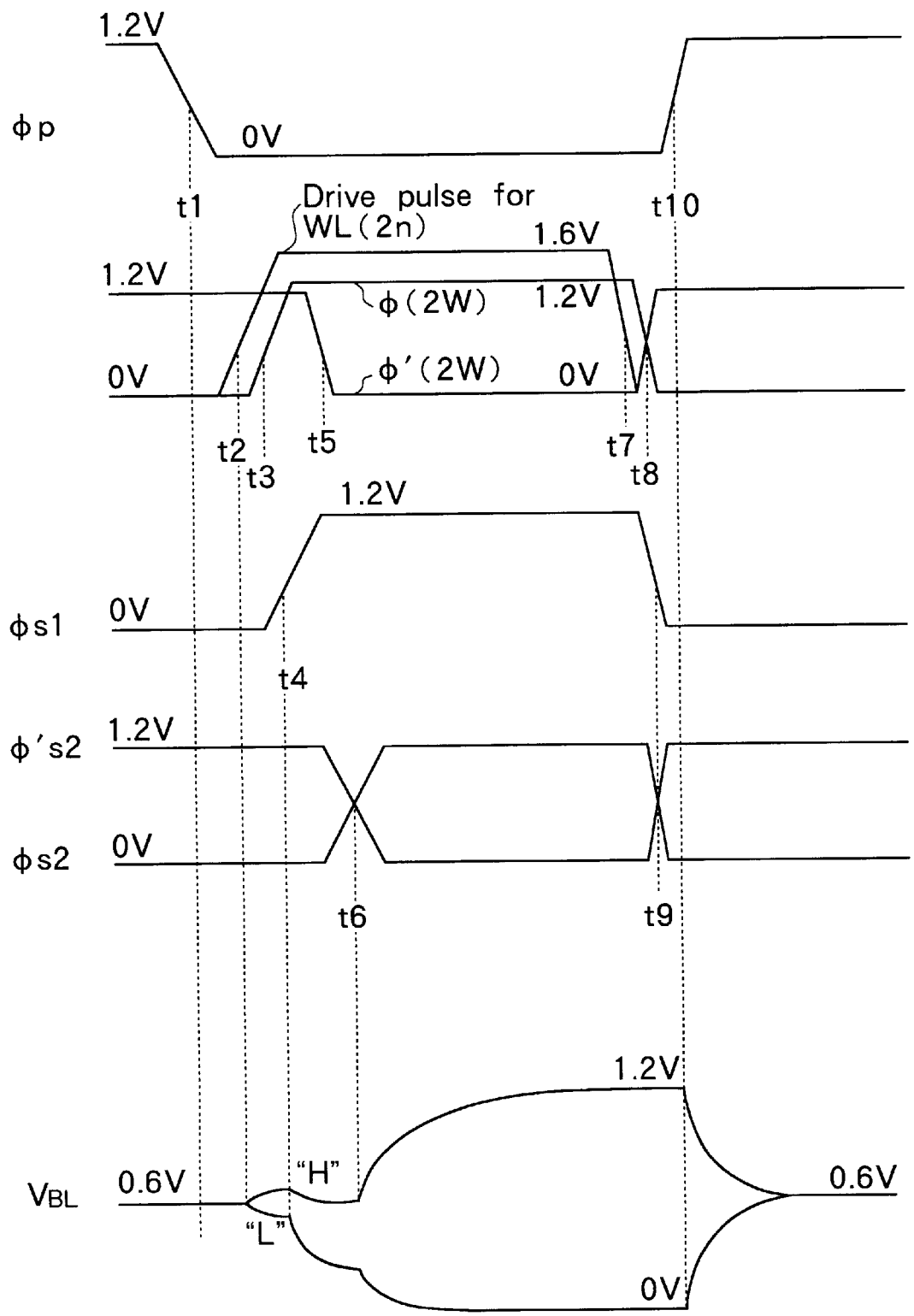
FIG. 2 is a timing chart showing signal waveforms generated at the time of operation of the DRAM according to the present invention.

FIG. 1 shows the principal circuit configuration of the DRAM according to the present embodiment, and FIG. 2 shows signal waveforms generated during the operation of the DRAM.

The semiconductor memory integrated circuit according to the present embodiment is formed into two-transistor-memory-cell DRAM which employs as a basic unit of memory a memory cell comprising a pair of access transistors, i.e., MOS transistors Qn(s) and Qn(s+1), and one memory capacitor C(t). Here, "s" represents an odd number, and "t" represents a natural number greater than or equal to one. Either the source or drain of the MOS transistor Qn(s) and either the drain or source of the MOS transistor Qn(s+1) are connected to individual electrodes of the memory capacitor C(t). For instance, either the source or drain of the MOS transistor Qn(s) and either the drain or source of the MOS transistor Qn(s+1) are connected to individual electrodes of a capacitor C1.

The memory cells are arranged in a matrix pattern. More specifically, the memory cells are arranged at respective intersections between a row of memory cells [2i−1], [2i], [2i+1], [2(i+1)] and a column of memory cells [2j−1], [2j], [2j+1], [2(j+1)] (where "i" and "j" represent natural numbers greater than or equal to one), thereby constituting a memory cell array.

The gate of each MOS transistor pair located at the intersections between even-numbered columns of memory cells and a certain even-numbered row of memory cells is connected to the word line extending along the even-numbered row of memory cells. For instance, the gate of one pair of MOS transistors Qn1 and Qn2 pertaining to an even-numbered column [2j] and the gate of a pair of MOS transistors Qn3 and Qn4 pertaining to another even-numbered column [2(j+1)], both MOS transistor pairs pertaining to an even-numbered row of memory cells [2i], are connected to a word line WL(2n) extending along the even-numbered memory cell row [2i].

Either one of a pair of bit lines BL(2j) and BL(2j+1) provided along the even-numbered column [2j] is connected to either the source or drain of one of a pair of MOS transistors (e.g., MOS transistors Qn1 and Qn2) which are activated by a word line of an even-numbered row (e.g., WL(2n)), and the remaining one of the bit line pair is connected to either the source or drain of the remaining MOS transistor.

Similarly, the gate of each MOS transistor pair located at the intersections between odd-numbered columns of memory cells and a certain odd-numbered row of memory cells is connected to the word line extending along the odd-numbered row of memory cells. For instance, the gate of one pair of MOS transistors Qn5 and Qn6 pertaining to an odd-numbered column [2j−1] and the gate of a pair of MOS transistors Qn7 and Qn8 pertaining to another odd-numbered column [2j+1], both MOS transistor pairs pertaining to an odd-numbered row of memory cells [2j+1], are connected to a word line WL(2n+1) extending along the odd-numbered memory cell row [2i+1].

Either one of a pair of bit lines BL(2j+1) and BL(2(j+1)) provided along the odd-numbered column [2j+1] is connected to either the source or drain of one of a pair of MOS transistors (e.g., MOS transistors Qn7 and Qn8) which are activated by a word line of an odd-numbered row (e.g., WL(2n+1)), and the remaining one of the bit line pair is connected to either the source or drain of the remaining MOS transistor.

As mentioned above, in the memory cell array of the DRAM according to the present embodiment, one bit line is shared as a common information signal line between two adjacent columns of memory cells. For instance, the bit line BL(2j) is shared between the adjacent columns of memory cells [2j−1] and [2j], and a bit line BL(2j+1) is shared between the adjacent columns of memory cells [2j] and [2j+1]. The same applies to the other columns of memory cells and bit lines.

A pair of bit lines BL(2j−1) and BL(2j) are provided for the column of memory cells [2j−1]. One end of the bit line BL(2j−1) is connected to a complementary I/O contact point (or sense node) A of a first sense circuit SC1 formed from a flip-flop circuit, by way of an n-channel transmission MOS transistor N1, and one end of the bit line BL(2j) is connected to another complementary I/O contact point (or sense node) B of the first sense circuit SC1, by way of an n-channel transmission MOS transistor N2. Moreover, a pair of bit lines BL(2j) and BJ(2j+1) are provided for the column of memory cells [2j]. One end of the bit line BL(2j) is connected to a complementary I/O contact point (or sense node) A of the first sense circuit SC1 by way of an n-channel transmission MOS transistor N3, and one end of the bit line BL(2j+1) is connected to another complementary I/O contact point B of the first sense circuit SC1, by way of an n-channel transmission MOS transistor N4. The flip-flop circuit constituting the first sense circuit SC1 comprises a pair of n-channel drive MOS transistors NF1 and NF2 of so-called cross-connection configuration, wherein the drain of one transistor is connected to the gate of the other transistor, and the gate of the one transistor is connected to the drain of the other transistor.

The gate of the pair of n-channel transmission MOS transistors N1 and N2 is activated by means of a clock signal φ(2W+1) which is activated in synchronicity with activation of the odd-numbered word lines WL(2n−1), WL(2n+1), . . . As a result, information signals flowing through the pair of bit lines BL(2j−1) and BL(2j) provided along the odd-numbered column [2j−1] are transmitted to sense nodes A and B of the first sense circuit SC1. Further, the gate of the pair of n-channel transmission MOS transistors N3 and N4 is activated by means of a clock signal φ(2W) which is activated in synchronicty with activation of the even-numbered word lines WL(2n), WL2(n+1), . . . As a result, information signals flowing through the pair of bit lines BL(2j) and BL(2j+1) provided along the even-numbered column [2j] are transmitted to sense nodes A and B of the first sense circuit SC1. The same applies to n-channel transmission MOS transistors connected to other bit line pairs.

The information signal is transmitted from the sense node A to a signal bus I/O' by way of an n-channel transmission MOS transistor NT1, which is turned on by means of a Y-DEC1 signal output from an unillustrated Y decoder, and the information signal is transmitted from the sense node B to a signal bus I/O by way of an n-channel transmission MOS transistor NT2, which is also turned by means of the Y-DEC1 signal. The signal buses I/O and I/O' are provided for the purpose of transmitting complementary signals.

The commonly-connected sources of the pair of n-channel drive MOS transistors NF1 and NF2 that constitute the flip-flop circuit serving as the first sense circuit SC1 are connected to a common source line SN. The same applies to the commonly-connected sources of the pair of n-channel MOS transistors NF3 and NF4 that constitute a flip-flop circuit serving as the first sense circuit SC1 for another column. The source line SN is connected to commonly-connected drains of the n-channel MOS transistors NS1 and NS2. The n-channel MOS transistor NS1 is activated by means of a signal φs1 applied to the gate of the transistor NS1, and the n-channel MOS transistor NS2 is activated by means of a signal φs2 applied to the gate of the transistor NS2. The source of the MOS transistor NS1 and that of the MOS transistor NS2 are connected to a reference potential GND. The source line SN is also connected to the source of a pre-charge MOS transistor NP1. This precharge MOS transistor NP1 is activated by means of a pre-charge pulse signal φp applied to the gate of the transistor NP1. At the time of precharge, the source line SN becomes recharged by means of a power line Vcc connected to the drain of the MOS transistor NP1.

Similarly, the other end of the bit line BL(2j−1) provided for the column of memory cells [2j−1] is connected to a complementary I/O contact point (or sense node) C of a second sense circuit SC2 formed from a flip-flop circuit, by way of a p-channel transmission MOS transistor P1, and the other end of the bit line BL(2j) provided for the column of memory cells [2j−1] is connected to another complementary I/O contact point (or sense node) D of the second sense circuit SC2, by way of a p-channel transmission MOS transistor P2. Moreover, the other end of the bit line BL(2j) provided for the column of memory cells [2j] is connected to the sense node C of the second sense circuit SC2 by way of a p-channel transmission MOS transistor P3, and the other end of the bit line BL(2j+1) provided for the column of memory cells [2j] is connected to the sense node D of the second sense circuit SC2, by way of a p-channel transmission MOS transistor P4. The flip-flop circuit constituting the second sense circuit SC2 comprises a pair of p-channel drive MOS transistors PF1 and PF2 of so-called cross-connection configuration, wherein the drain of one transistor is connected to the gate of the other transistor, and the gate of the one transistor is connected to the drain of the other transistor.

The commonly-connected sources of the pair of p-channel drive MOS transistors PF1 and PF2 that constitute the flip-flop circuit serving as the second sense circuit SC2 are connected to a common source line SP. The same applies to the commonly-connected sources of the pair of p-channel MOS transistors PF3 and PF4 that constitute a flip-flop circuit serving as the second sense circuit SC2 for another column. The source line SP is connected to the drain of the p-channel MOS transistors PS1. The p-channel MOS transistor PS1 is activated by means of a signal φ's2 applied to the gate of the transistor PS1. The source of the MOS transistor PS1 is connected to the power line Vcc. The source line SP is also connected to the drain of an n-channel pre-charge MOS transistor NP2. The n-channel precharge MOS transistor NP2 is activated by means of the pre-charge pulse signal φp. At the time of pre-charge, the potential of the source line SP is lowered to the reference potential GND connected to the source of the MOS transistor NP2.

A signal is transmitted to the second sense circuit SC2 formed from the p-channel MOS transistor in the similar manner as in the first sense circuit SC1. More specifically, the gate of the pair of p-channel transmission MOS transistors P1 and P2 is activated by means of the clock signal φ'(2W+1) which is activated in synchronicity with activation of the odd-numbered word lines WL(2n+1), WL(2n+3), . . . As a result, information signals flowing through the pair of bit lines BL(2j−1) and BL(2j) are transmitted to sense nodes C and D of the second sense circuit SC2. Further, the gate of the pair of p-channel transmission MOS transistors P3 and P4 is activated by means of the clock signal φ'(2W), which is activated in synchronicity with activation of the even-numbered word lines WL(2n), WL2(n+1), . . . As a result, information signals flowing through the pair of bit lines BL(2j) and BL(2j+1) are transmitted to sense nodes C and D of the second sense circuit SC2, respectively. The same applies to p-channel transmission MOS transistors connected to other bit line pairs.

Balancing n-channel MOS transistors NE1, NE2, and NE3 are provided in such a way that each transistor is interposed between a pair of bit lines provided for a certain column of memory cells and that the source and drain of the transistor are connected to the pair of bit lines, respectively. More specifically, the balancing n-channel MOS transistor NE1 is connected between the pair of bit lines BL(2j−1) and BL(2j), for instance. The balancing n-channel MOS transistor NE2 is connected between the pair of bit lines BL(2j) and BL(2j+1). The same applies to the other bit lines. The balancing n-channel MOS transistor NE1 and others are activated by means of the pre-charge pulse signal φp applied to the gate of each of the balancing transistors. As a result, at the time of pre-charge, the pair of bit lines of all the columns of memory cells are maintained at the same potential.

Operations of the DRAM having the foregoing configuration will now be described by reference to FIG. 2. The following description is directed to an example in which an information signal is read from the memory cell C1.

As shown in FIG. 2, the pre-charge pulse signal φp is held at a high potential (+1.2V) before time t1, and hence the n-channel MOS transistors NE1 to NE4 which are activated by this pulse signal bring each bit line pair into conduction. A potential VBL of a pair of bit lines assumes the same potential (e.g., +0.6V) for each bit line. All the transmission MOS transistors N1, N2, N3, N4, P1, P2, P3, and P4 are held in a cut-off state by means of corresponding drive pulse signals, i.e., clock signals φ(2W+1), φ(2W), φ'(2W+1), and φ'(2W). Therefore, all the bit lines are disconnected from the first or second sense circuits SC1 or SC2.

When the pre-charge pulse signal φp is at a high positive potential (+1.2V) and the n-channel MOS transistors NP1 and NP2 are in an ON state, the common source line SN of the first sense circuit SC1 assumes the supply potential Vcc (=+1.2V), and the common source line SP of the second sense circuit SC2 assumes the reference potential (=0V).

When the potential of the pre-charge pulse signal φp drops to 0V at time t1, the n-channel MOS transistors NE1 to NE4, NP1, and NP2 that are activated by this pulse signal are cut off, and the bit lines are disconnected from one another. Further, the source lines SN and SP are disconnected from the supply potential and the ground potential, respectively.

Subsequently, at time t2, the word line WL(2n) is activated, so that the potential of the word line rises to a potential of +1.6V, thereby turning on the n-channel MOS transistors Qn1, Qn2, Qn3, and Qn4. As a result, the information stored in the memory capacitor C1 is transmitted through the pair of bit lines BL(2j) and BL(2j+1), and the information stored in the memory capacitor C2 is transmitted through the pair of bit lines BL2(j+1) and BL((j+1)+1). Specifically, when one of the pair of bit lines is at a high level, the remaining bit line is at a low level. A potential difference VBL between the bit lines of the pair assumes a minute value of about 0.2V.

When the drive pulse signal; that is, the clock signal φ(2W), rises at time t2 or at time t3 that slightly lags behind time t2, the n-channel transmission MOS transistors N3 and N4 of the first sense circuit SC1 are turned on. The minute potential difference between the pair of bit lines BL(2j) and BL(2j+1) is supplied to a point between the sense nodes A and B of the first sense circuit SC1.

When the first sense signal φs1 rises at time t4 slightly lagging behind time t3, the n-channel MOS transistor NS1 having a small current capacity is turned on.

When the n-channel MOS transistor NS1 is brought into conduction, the potential difference between the pair of bit lines increases.

When the clock signal φ'(2W) drops at time t5, the p-channel transmission MOS transistors P3 and P4 of the second sense circuit SC2 are activated to an ON state. As a result, the increased potential difference between the pair of bit lines is transmitted to the sense nodes C and D of the second sense circuit SC2.

At time t5 or time t6 slightly lagging behind time t5, the potential difference between the source line SN of the first sense circuit SC1 and the source line SP of the second sense circuit SC2 rapidly increases. As a result, the second sense signal φs2 rises, the n-channel MOS transistor NS2 having large current capacity is turned on, and the source line SN drops to a reference voltage of 0V. At the same time, the third sense signal φ's2 whose phase is complementary to the phase of second sense signal φs2 drops, and the p-channel MOS transistor PS1 having a large current capacity is turned on, so that the potential of the source line SP of the second sense circuit SC2 rises to a supply potential of 1.2V.

Through the foregoing operations of the sense circuits SC1 and SC2, the potential difference between the sense nodes of each sense circuit (e.g., the potential difference between the sense nodes A and B) increases until the potential VBL of one bit line of the bit line pair is brought to a high level (1.2V) and the potential VBL of the other bit line is brought to a low level (0V). Since the clock signal φ(2W) is activated at a high potential, the n-channel transmission MOS transistors N3 and N4 are active. Consequently, the potential difference between the sense nodes A and B, for example, is transmitted to the bit line pair, and the memory capacitors C1, C2, . . . of the memory cells are refreshed. In other words, the information that had been stored in the memory cells before being read is reproduced (or reconstructed).

The decode signal Y-DEC1 is selectively applied to the gates of the n-channel transmission MOS transistors NT1 and NT2 which establish connection between the sense nodes A and B of the first sense circuit SC1, and the complementary input/output lines I/O' and I/O, thereby activating the transmission transistors. As a result, the potential difference between the sense nodes A and B of the sense circuit SC1, for example, is transmitted to the individual input/output lines I/O' and I/O, whereby the information related to the memory capacitor C1 is output to the outside. Similarly, information is read from the memory capacitor C2 by means of a decode signal Y-DEC2. Information is written into the memory cells C1 and C2 by means of reversing the foregoing order.

Subsequently, when the potential of the word line WL(2n) drops at time t7, the memory cells that include the memory capacitor C1 are separated from the bit line. When the potentials of the pulse signals φ(2W) and φ'(2W) are interchanged, the n-channel transmission MOS transistors N3 and N4 and the p-channel transmission MOS transistors P3 and P4 that maintain continuity between the bit lines and the sense circuits are cut off.

When the potential of each of the sense signals φs1, φs2, and φs2 is inverted at time t9, the MOS transistors NS1, NS2, and PS1 are cut off. When the pre-charge pulse signal (p resumes a high potential at time t10, respective nodes are brought to their initial states. That is, when the n-channel balancing MOS transistors NE1 and NE2 are activated and brought into conduction, the high potential of one bit line of the bit line pair and the low potential of the remaining bit line are rapidly averaged, and the potentials VBL of the bit lines are balanced at an intermediate potential (=+0.6V).

As has been mentioned above, in the DRAM according to the present invention, the information signal stored in the memory capacitor is guided to the bit line pair through use of the two-transistor memory cells, thereby enabling the DRAM to operate at a lower voltage with stability and at high speed. Further, a single bit line is shared between adjacent two memory cells, and a single sense circuit is shared between two adjacent columns of memory cells, thus enabling much greater integration of the DRAM.

In an ordinary CMOS sense amplifier, a variation in the electrical characteristics of the p-channel MOS transistor arising at the time of manufacture of the transistor is greater than an analogous variation in the electrical characteristics of the n-channel MOS arising at the time of manufacture of the transistor. The gate of the p-channel MOS transistor constituting the gated flip-flop circuit is designed so as to become longer than that of the n-channel MOS transistor. However, this method is accompanied not only by design difficulty but also by a drop in the gain of amplification of the sense circuit of the p-channel MOS transistor.

In contrast, in the DRAM according to the present embodiment, the first sense circuit SC1 and the second sense circuit SC2 are operated separately from each other, so that the voltage of a read signal is amplified in two stages. More specifically, the first sense circuit SC1 formed from highly sensitive n-channel MOS transistors is activated at the initial stage so as to amplify the potential difference between the pair of bit lines. Subsequently, the second sense circuit SC2 formed from p-channel MOS transistors is operated so as to accelerate amplification of the potential difference to the supply voltage level. That is in the DRAM according to the present embodiment, after the potential difference between signals has been amplified to a certain extent by means of the first sense circuit SC1, the second sense circuit SC2 formed from p-channel MOS transistors is activated. Therefore, the p-channel MOS transistor and the n-channel MOS transistor, which together constitute the gated flip-flop circuit, can be made equal in length. Consequently, it becomes feasible to realize easy designing of DRAM, reliable sense operations, and a reduction in the time required for amplifying a signal voltage to a supply voltage.

As has been mentioned, a semiconductor memory integrated circuit according to the present invention enables high-density packing of memory cells and sense circuits and compatibility between stable operations on one hand, and a reduction in a supply voltage and an increase in operating speed on the other hand.

Obviously, many modifications and variations of the present invention are possible in the light of the above teachings. Therefore, it is to be understood that, within the scope of the appended claims, the invention may be practiced through embodiments other than as specifically described.

What is claimed is:

1. A semiconductor-memory integrated circuit comprising:

memory cells arranged in a matrix pattern, wherein each memory cell includes a pair of access transistors and a memory capacitor which is interposed between the pair of access transistors and is connected to the source or drain of each of the access transistors, word lines which are provided in a pair for each row of memory cells, in which the gates of the respective memory cells pertaining to the row are alternately connected with the pair of word lines;

bit lines, each of which is provided so as to be shared between two adjacent columns of memory cells, in which the bit line is connected to the drain or source of an individual access transistor of each memory cell pertaining to the individual column of memory cells; and sense circuits, each of which is provided so as to be shared between two adjacent columns of memory cells, wherein each sense circuit detects an information signal appearing on a pair of bit lines corresponding to the respective column of memory cells when a pair of word lines are activated at different timings.

2. A semiconductor memory integrated circuit according to claim 1, wherein the sense circuit comprises a first gate-operation flip-flop circuit formed from n-channel transistors; and a second gate-operation flip-flop circuit formed from p-channel transistors.

3. A semiconductor memory integrated circuit according to claim 2, wherein, during a sensing operation, the first flip-flop circuit is activated at a timing differing from that at which the second flip-flop circuit is activated.

4. A semiconductor memory integrated circuit according to claim 2, wherein, during a sensing operation, the first flip-flop circuit is activated prior to the second flip-flop circuit.

5. A semiconductor memory integrated circuit according to claim 2, wherein the gate of the n-channel transistors of the first flip-flop circuit is made substantially equal in length to the gate of the p-channel transistors of the second flip-flop circuit.

6. A semiconductor memory integrated circuit according to claim 2, wherein the first flip-flop circuit has a complementary input node that includes a pair of first transmission transistors capable of controlling at a first timing connection between a pair of bit lines of the column of memory cells, and the second flip-flop circuit has a pair of second transmission transistors capable of controlling connection between a pair of bit lines of the column of memory cells at a second timing that lags behind the first timing.

* * * * *